US010460967B2

United States Patent
Suriki

(10) Patent No.: US 10,460,967 B2
(45) Date of Patent: Oct. 29, 2019

(54) OVERHEAD TRANSPORT VEHICLE SYSTEM AND TEACHING METHOD FOR OVERHEAD TRANSPORT VEHICLE

(71) Applicant: MURATA MACHINERY, LTD., Kyoto-shi, Kyoto (JP)

(72) Inventor: Keiichiro Suriki, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 16/101,580

(22) Filed: Aug. 13, 2018

(65) Prior Publication Data
US 2019/0074204 A1  Mar. 7, 2019

(30) Foreign Application Priority Data
Sep. 1, 2017  (JP) ................. 2017-168255

(51) Int. Cl.
*H01L 21/677* (2006.01)
*H01L 21/687* (2006.01)

(52) U.S. Cl.
CPC .. *H01L 21/67733* (2013.01); *H01L 21/67775* (2013.01); *H01L 21/68707* (2013.01)

(58) Field of Classification Search
CPC ......... H01L 21/67733; H01L 21/67775; H01L 21/68707; B66C 1/40; B66C 1/46; B66C 1/48; B66C 1/485; B66C 1/56; B65G 43/00; B65G 35/06
See application file for complete search history.

(56) References Cited

U.S. PATENT DOCUMENTS

| | | | |
|---|---|---|---|
| 7,854,202 B2 * | 12/2010 | Menser, Jr. ............... | B61B 3/02 104/127 |
| 9,589,821 B2 * | 3/2017 | Nishikawa ............. | G05B 15/02 |
| 9,758,310 B2 * | 9/2017 | Murao ................... | B65G 43/00 |
| 9,896,283 B2 * | 2/2018 | Tsuji ...................... | B65G 69/22 |
| 9,975,705 B2 * | 5/2018 | Kinugawa ............. | B65G 35/06 |
| 2009/0035104 A1 | 2/2009 | Onishi et al. | |
| 2013/0220959 A1 * | 8/2013 | Won .................... | H01L 21/6773 212/276 |
| 2019/0074204 A1 * | 3/2019 | Suriki ............... | H01L 21/67733 |
| 2019/0229003 A1 * | 7/2019 | Kesil ................ | H01L 21/67733 |

FOREIGN PATENT DOCUMENTS

JP        2009-292644 A        12/2009

* cited by examiner

*Primary Examiner* — Kaitlin S Joerger
(74) *Attorney, Agent, or Firm* — Keating & Bennett, LLP

(57) ABSTRACT

Each overhead transport vehicle in an overhead transport vehicle system includes a winding drum to wind a hoisting material, attached to a lift stage to transfer goods, by lap winding, and a controller that controls an amount of rotation of the winding drum to control a height of the lift stage. The amount of rotation of the winding drum corresponding to an overall length of the hoisting material, unique to each overhead transport vehicle, is stored, and the amount of rotation of the winding drum corresponding to the corresponding one of a plurality of transfer heights is calculated from the amount of rotation unique to each overhead transport vehicle.

5 Claims, 6 Drawing Sheets

ORIGINAL POINT (WOUND 100%)

$L_0 = \pi(D \cdot n^0 + t \cdot n^{0^2})$ $L_0$

D : DIAMETER OF DRUM $n^0$ : AMOUNT OF ROTATION OF WINDING DRUM

LOWERMOST POSITION (PAID OUT 100%)

OVERHEAD TRANSPORT VEHICLE SYSTEM AND TEACHING METHOD FOR OVERHEAD TRANSPORT VEHICLE

CROSS REFERENCE TO RELATED APPLICATIONS

This application claims the benefit of priority to Japanese Patent Application No. 2017-168255 filed on Sep. 1, 2017. The entire contents of this application are hereby incorporated herein by reference.

BACKGROUND OF THE INVENTION

1. Field of the Invention

The present invention relates to an overhead transport vehicle system, and more particularly, to controlling a lifting amount of a lift stage so as not to be affected by variations in thickness of a hoisting material for raising and lowering the lift stage.

2. Description of the Related Art

An overhead transport vehicle travels along a rail provided in a ceiling space of a clean room or the like, and pays out and winds a hoisting material such as a belt from a winding drum so as to raise and lower a lift stage, thereby transferring goods to and from a transfer destination such as a load port. The overhead transport vehicle transfers goods to and from transfer destinations with various heights, so that it is necessary to accurately determine a lifting amount of the lift stage corresponding to each transfer destination.

JP2009-35403A discloses the following method: (a) measuring a lifting amount of a lift stage with respect to all transfer destinations by using at least one reference overhead transport vehicle; (b) measuring only lifting amounts of the lift stage with respect to the corresponding plurality of representative specific transfer destinations, for other overhead transport vehicles, to obtain a plurality of differences in lifting amount from that of the overhead transport vehicle used in the step (a); and (c) correcting the lifting amount obtained in the step (a) using the plurality of differences obtained in the step (b) to calculate lifting amounts with respect to all corresponding transfer destinations for each overhead transport vehicle.

Unfortunately, the method of JP2009-35403A requires that lifting amounts of each overhead transport vehicle are measured at a respective plurality of places to cause teaching work to be large scale. Then, JP2009-35403A does not consider variations in thickness of the hoisting material.

SUMMARY OF THE INVENTION

Preferred embodiments of the present invention provide overhead transport vehicles each capable of calculating an amount of rotation of a winding drum, corresponding to a corresponding one of various transfer heights, by generally measuring a lifting amount at one transfer destination for each overhead transport vehicle even when a hoisting material varies in thickness for each overhead transport vehicle. This enables accurate transfer to a plurality of transfer destinations with simple teaching work.

An overhead transport vehicle system according to a preferred embodiment of the present invention is provided with a plurality of overhead transport vehicles each including: a winding drum to wind a hoisting material, attached to a lift stage to transfer goods, by lap winding; and a controller that controls the amount of rotation of the winding drum to control a height of the lift stage, the overhead transport vehicle system including: a storage that stores the amount of rotation of the winding drum corresponding to an overall length of the hoisting material, unique to each overhead transport vehicle; and a calculator that calculates the amount of rotation of the winding drum, corresponding to the corresponding one of a plurality of transfer heights, for each overhead transport vehicle, from the amount of rotation unique to each overhead transport vehicle stored in the storage.

A teaching method for an overhead transport vehicle system according to a preferred embodiment of the present invention is performed to teach the amount of rotation of a winding drum corresponding to the corresponding one of a plurality of transfer heights for each of overhead transport vehicles, the overhead transfer vehicle system being provided with the plurality of overhead transport vehicles each including: a winding drum to wind a hoisting material, attached to a lift stage to transfer goods, by lap winding; and a controller that controls the amount of rotation of the winding drum to control a height of the lift stage to transfer the goods, the teaching method including the steps of: measuring the amount of rotation of the winding drum corresponding to an overall length of the hoisting material, unique to each of the overhead transport vehicles; measuring a transfer height at each of transfer positions using at least one overhead transport vehicle; and calculating the amount of rotation of the winding drum for each of the transfer positions for each of the overhead transport vehicles, from the transfer height measured and the amount of rotation of the winding drum corresponding to the overall length of the hoisting material, unique to each of the overhead transport vehicles.

When the winding drum has a constant diameter and the hoisting material has a constant overall length, variations in thickness of the hoisting material mainly cause a difference (variation) in the amount of rotation of the winding drum for each transfer height for each overhead transport vehicle. Thus, in a preferred embodiment of the present invention, the amount of rotation of the winding drum corresponding to the overall length of the hoisting material, unique to each overhead transport vehicle, is measured and stored in the storage. This amount of rotation enables thickness of the hoisting material to be determined. When the thickness of the hoisting material is determined, the amount of rotation of the winding drum corresponding to the corresponding one of transfer heights is determined. The transfer height for each of a plurality of transfer destinations may be measured by using one overhead transport vehicle, for example.

The amount of rotation of the winding drum corresponding to the overall length of the hoisting material, unique to each overhead transport vehicle, may be measured at a manufacturing factory or the like (one location) of the overhead transport vehicle, for example. This facilitates teaching work as compared with when teaching work is performed at a plurality of places in the overhead transport vehicle system. In addition, the amount of rotation corresponding to the overall length of the hoisting material is obtained, so that a reliable amount of rotation is able to be obtained for any transfer height. This enables a reliable transfer operation to be performed with respect to any transfer height by simple teaching work.

It is preferable that each overhead transport vehicle includes an end sensor to detect that the hoisting material is paid out to its end portion from the winding drum. This facilitates measurement of the amount of rotation of the winding drum corresponding to the overall length of the hoisting material, unique to each overhead transport vehicle.

It is preferable that the calculator calculates thickness t of the hoisting material according to the following equation (1), $$t=(L_0-\pi \cdot D \cdot n_0)/\pi n_0^2 \quad (1)$$

where the amount of rotation of the winding drum corresponding to the overall length of the hoisting material is indicated as $n_0$, the overall length of the hoisting material is indicated as $L_0$, a diameter of the drum is indicated as D, and the circumference ratio is indicated as $\pi$. Between $L_0$ and t, the following equation (2) is satisfied.

$$L_0=\pi(D \cdot n_0+t \cdot n_0^2) \quad (2)$$

When equation (2) is solved for t, equation (1) is satisfied. This enables the thickness t of the hoisting material to be determined. Here, the amount of rotation corresponding to one revolution of the winding drum is indicated as 1. In addition, the amount of rotation of the winding drum may be converted into an encoder value or the like of a motor that rotates the winding drum.

It is preferable that the calculator calculates the amount of rotation $\Delta n$ of the winding drum to lower the lift stage from a state where the hoisting material is wound by its overall length to a position with a transfer height of L according to the following equation (3).

$$\Delta n=((L_0-L)/(\pi \cdot t)+(D/2t)^2)^{1/2}-(D/2t) \quad (3)$$

The amount of rotation to raise the lift stage from the lowermost position to the position with the transfer height of L is indicated as n, and the amount of rotation to lower the lift stage from the uppermost position to the position with the transfer height of L is indicated as follows: $\Delta n=n_0-n$. At this time, the following equation (4) is satisfied.

$$L=L_0-\pi(D \cdot \Delta n+t \cdot \Delta n^2) \quad (4)$$

When equation (4) is solved for $\Delta n$, equation (3) is obtained. Then, the amount of rotation $\Delta n$ of the winding drum corresponding to the corresponding one of the transfer heights is able to be determined from equation (3).

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
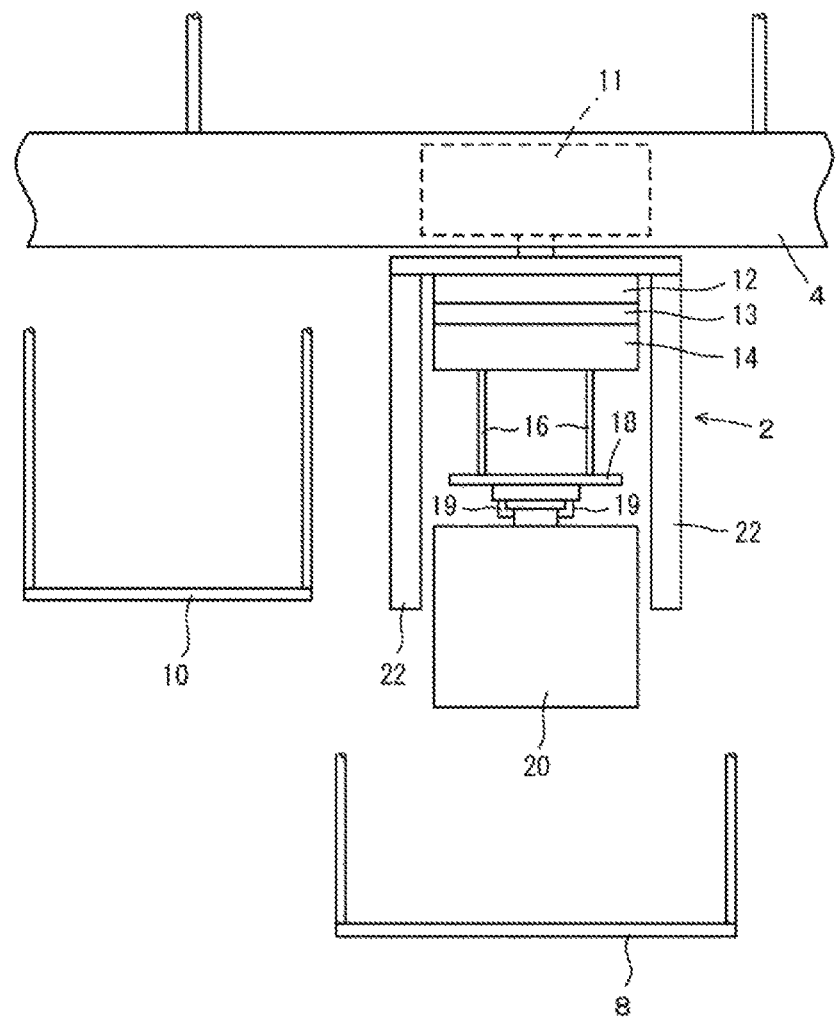
FIG. 1 illustrates a side surface of an overhead transport vehicle, a traveling rail, a load port being a transfer destination, an under buffer, and a side buffer, in a preferred embodiment of the present invention.

Hereinafter, preferred embodiments of the present invention will be described. The scope of the present invention should be determined in accordance with understanding of those skilled in the art based on the description of the scope of claims, in consideration of the description of the specification and well-known techniques in this field.

FIGS. 1 to 6 each illustrate an overhead transport vehicle system, and a teaching method for the overhead transport vehicle system according to preferred embodiments of the present invention. FIGS. 1 to 4 each illustrate a configuration of an overhead transport vehicle 2. The overhead transport vehicle 2 travels while being supported by a traveling rail 4 provided in a ceiling space or the like of a clean room, and transfers goods such as an FOUP 20 or a reticle pod among a load port 6 such as a semiconductor processing apparatus, an under buffer 8 immediately below the traveling rail 4, a side buffer 10 lateral to the traveling rail 4, and the like.

The overhead transport vehicle 2 travels using a traveling unit 11 accommodated in the traveling rail 4, and a cross-feed unit 12 transversely feeds a rotating unit 13 and a lift drive unit 14 in a direction perpendicular to the traveling rail 4 in a horizontal plane. The rotating unit 13 rotates the lift drive unit 14 around a vertical axis, and the lift drive unit 14 moves up and down a lift stage 18 by winding or paying out a plurality of hoisting materials such as belts 16. The cross-feed unit 12 and the rotating unit 13 may not be provided. As the hoisting material, a wire, a rope, or the like may be used in place of the belt. While a resin belt containing a core wire preferably is used as a belt 16 in the present preferred embodiment, for example, any kind of belt, such as a steel belt, may be used. While four hoisting materials such as the belts 16 preferably are used in the present preferred embodiment, three or six hoisting materials may be used, for example. The lift stage 18 includes a chuck 19 that is able to be freely opened and closed, and that holds goods such as the FOUP 20. In this specification, a height of the lift stage 18 when the hoisting material 16 is wound by its overall length is defined as an original point in the height direction of the lift stage 18, and the height from the transfer destination to the original point is indicated as a transfer height L.

Figure 2:
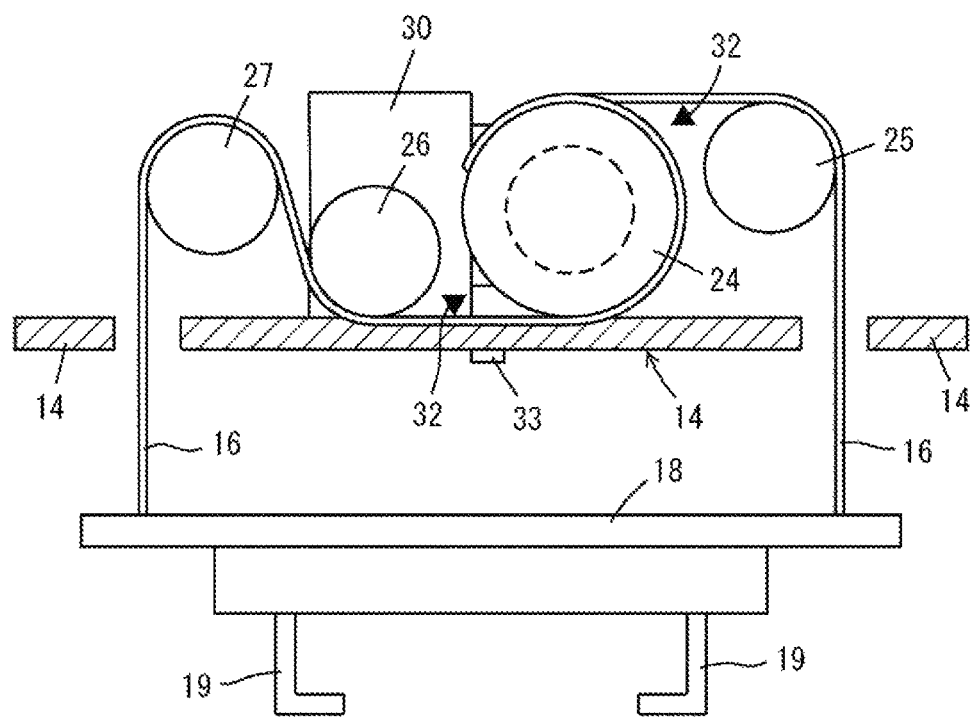
FIG. 2 is a side view illustrating a winding mechanism of a belt (hoisting material) in an overhead transport vehicle in a preferred embodiment of the present invention.
Figure 3:
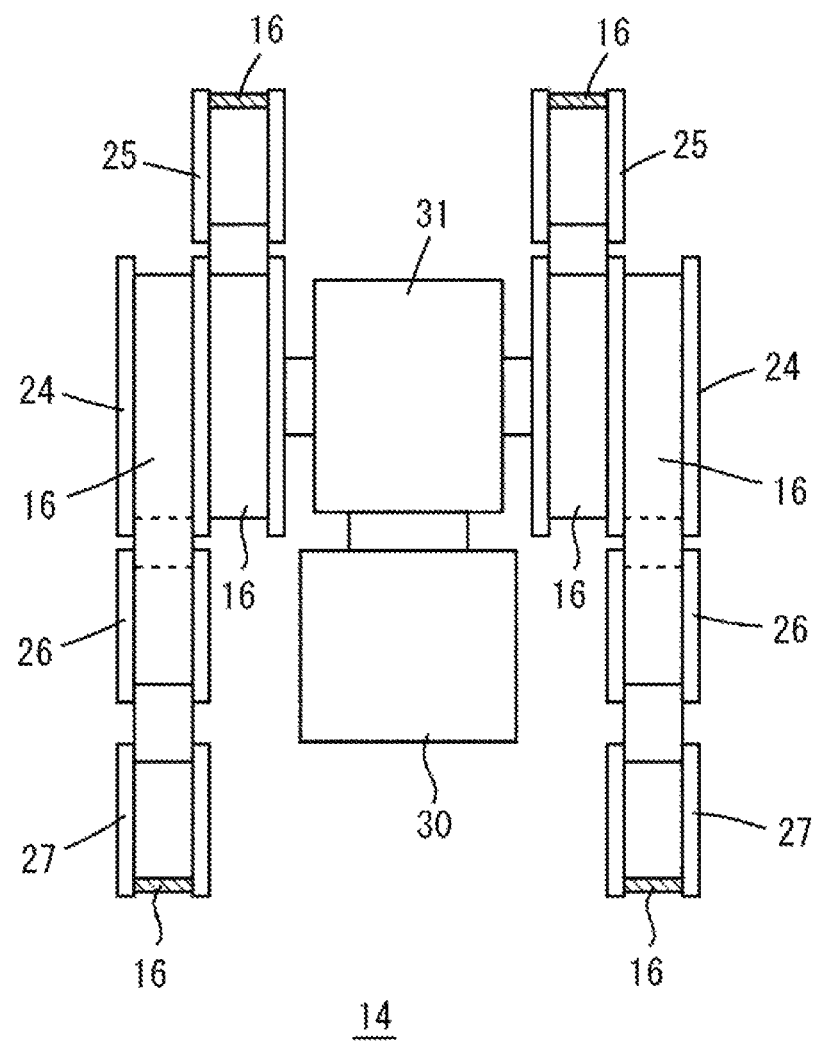
FIG. 3 is a plan view illustrating the winding mechanism of the belt (hoisting material) in an overhead transport vehicle in a preferred embodiment of the present invention.

FIGS. 2 and 3 each illustrate a winding and paying-out mechanism of the hoisting material such as the belt 16 in the lift drive unit 14. Winding drums 24 wind the belts 16 by lap winding, and one of the winding drums 24 winds two belts 16 and 16. The winding drum 24 winds and pays out the two belts 16 and 16 via an idler pulley 25, and idler pulleys 26 and 27. The pair of left and right winding drums 24 and 24 is disposed coaxially corresponding to four belts 16, and is rotated by a motor 30 and a speed reducer 31. While the motor 30 preferably is a servo motor in the preferred embodiment, for example, it may be a stepping motor or the like. Each of the winding drums 24 is provided in its vicinity with a belt end sensor 32 to detect that each of the belts 16 is paid out to its end, or paid out by its overall length. The belt end sensor 32 is preferably provided for each belt 16. When any one of the four belt end sensors 32 detects the end of the belt, it is determined that the overall length of the belt 16 is paid out, and the lift stage 18 is lowered to the lowering limit. It is preferable that an original-point sensor 33 is provided in the lift drive unit 14 or the like to detect that the lift stage 18 is raised to the rising limit (original point).

While the belt 16 varies in thickness, a plurality of belts with thickness varying within an allowable range is used for one overhead transport vehicle 2. In addition, the belt 16 is easily made constant in length. The belt 16 has an overall length $L_0$ that is made constant in one overhead transport vehicle 2, and also among a plurality of overhead transport vehicles 2.

Figure 4:
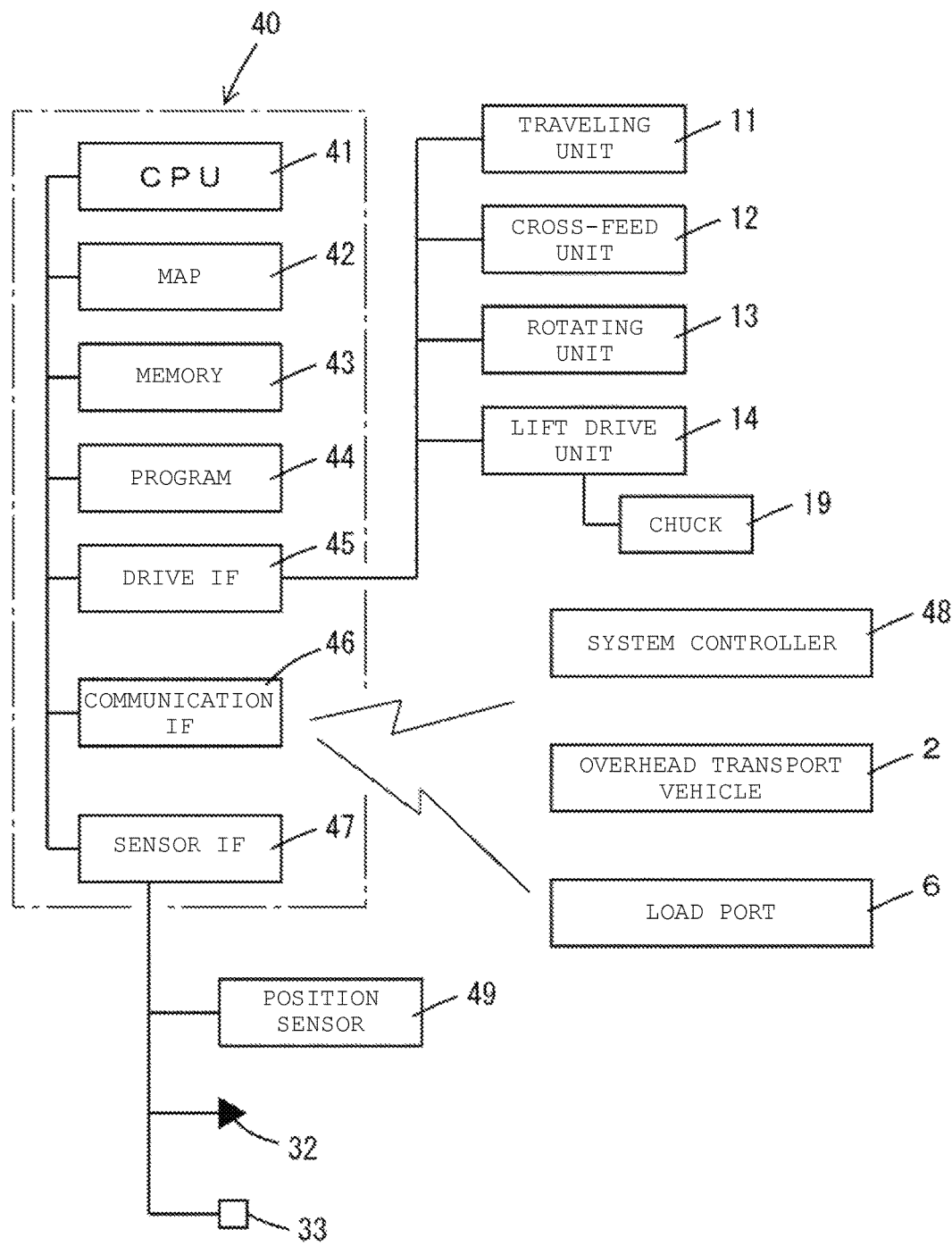
FIG. 4 is a block diagram illustrating a control system of the overhead transport vehicle in a preferred embodiment of the present invention.

FIG. 4 illustrates a control system of the overhead transport vehicle 2, and a controller 40 includes a CPU 41 (corresponding to the calculator) and a map memory 42 storing a map of the overhead transport vehicle system. The map memory 42 stores a stop position of the overhead transport vehicle 2, a distance to transversely feed the lift drive unit 14, and a rotation angle to rotate the lift drive unit 14, with respect to a transfer destination of goods such as the FOUP 20. The map memory 42 further stores a lifting distance L to raise and lower the lift stage 18, or the amount of rotation n of the winding drum, for each transfer destination.

The memory 43 is a general-purpose memory and stores various data. The memory 43 (corresponding to a storage in the scope of claims) particularly stores a thickness t of the belt 16, a diameter D of the winding drum 24, and the like. A program memory 44 stores programs required by the controller 40. In the present preferred embodiment, the memory 43 stores the thickness t of the belt and the diameter D of the winding drum 24, and the CPU 41 obtains a corrected amount of rotation n in accordance with belt thickness by every time of transfer.

A drive interface 45 controls a mechanical system of the overhead transport vehicle 2 and particularly drives the traveling unit 11, the cross-feed unit 12, the rotating unit 13, and the lift drive unit 14. A communication interface 46 communicates with a system controller 48 of the entire overhead transport vehicle system, another overhead transport vehicle 2, the load port 6, and the like. The overhead transport vehicle system includes the plurality of overhead transport vehicles 2, the traveling rail 4, the buffers 8 and 10, the system controller 48, and the like. The sensor interface 47 acquires signals from sensors such as a position sensor 49 to detect a position of the overhead transport vehicle 2 along the traveling rail 4, the belt end sensor 32, and the original-point sensor 33.

The storage and the calculator in the scope of claims may be provided in the system controller 48 of the entire overhead transport vehicle system to allow the system controller 48 to calculate the amount of rotation of the winding drum for each transfer destination, and the map memory 42 of the overhead transport vehicle 2 may store calculation results.

Figure 5:
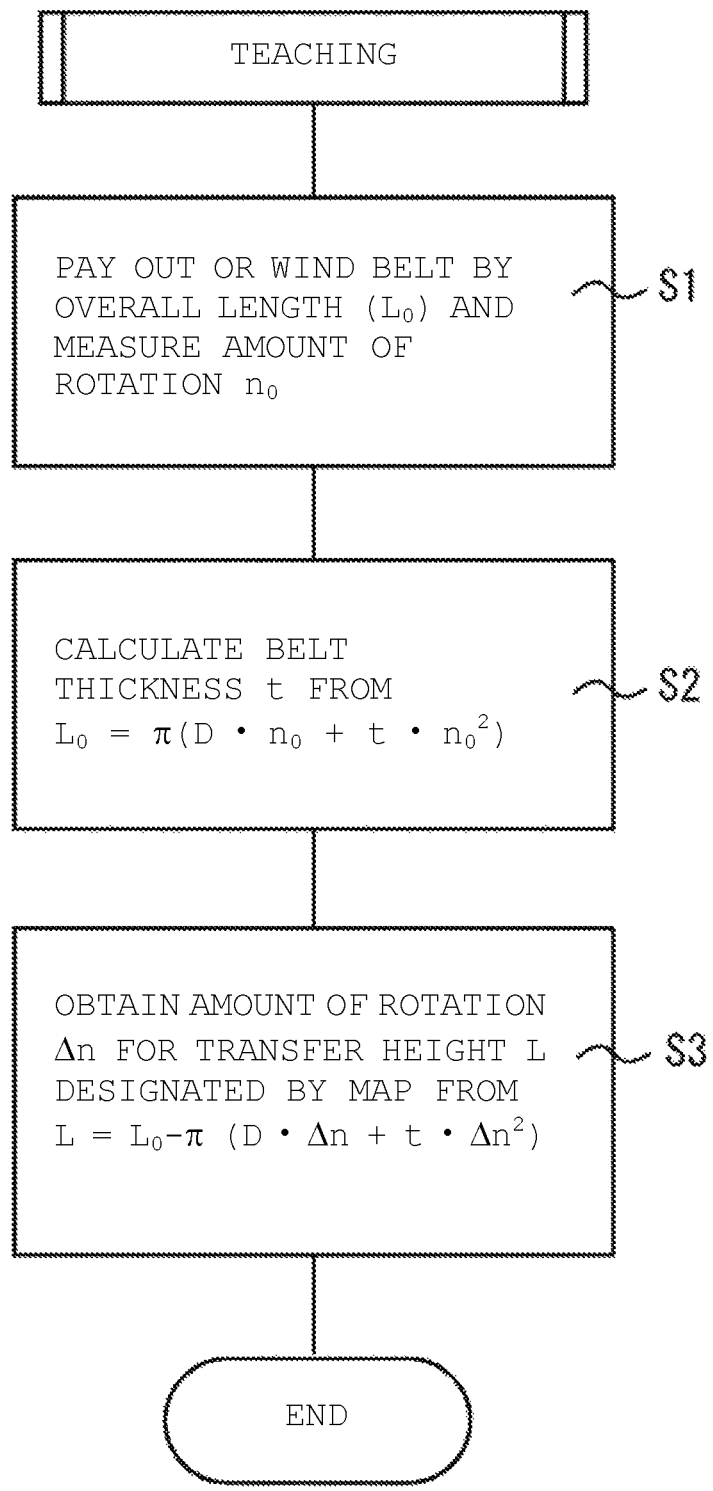
FIG. 5 is a flowchart illustrating a teaching method for each overhead transport vehicle in a preferred embodiment of the present invention.
Figure 6:
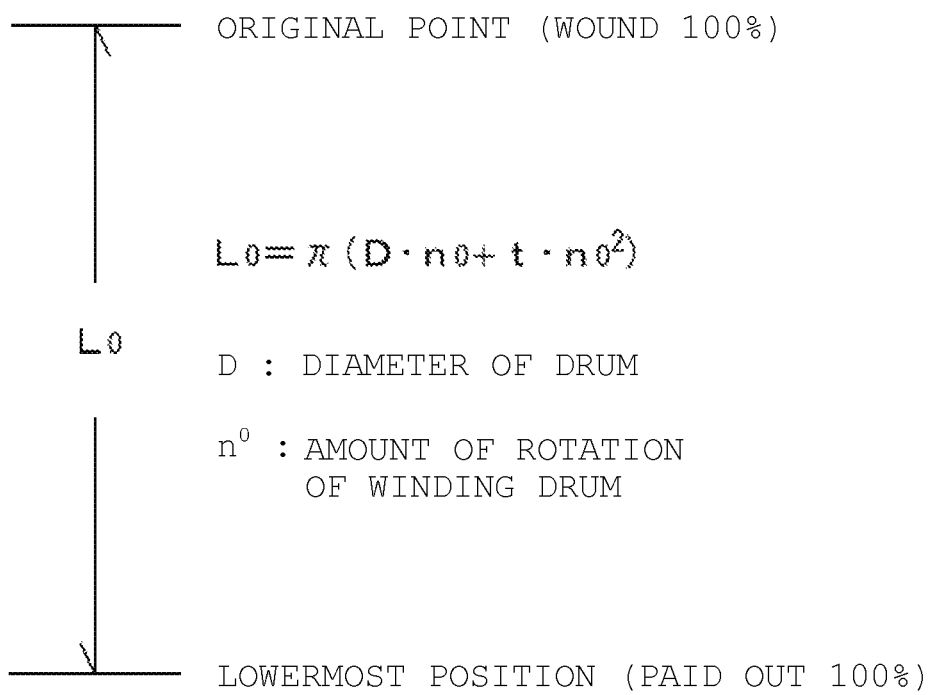
FIG. 6 illustrates a relationship between an overall length $L_0$ of the belt and the amount of rotation no of the winding drum unique to the overhead transport vehicle when the belt is paid out by its overall length from an overhead transport vehicle in a preferred embodiment of the present invention.

FIG. 5 illustrates a teaching method for each overhead transport vehicle. In step S1, the belt is paid out by its overall length or wound for its overall length, and the amount of rotation no of the winding drum at this time is measured. This work can easily be performed in a manufacturing factory of an overhead transport vehicle, for example. The following equation (2) is satisfied, where the circumference ratio is indicated as $\pi$, a diameter of the winding drum is indicated as D, and a thickness of the belt (measured throughout the overall length of the belt) is indicated as t. FIG. 6 illustrates a relationship between $L_0$ and t, etc.

$$L_0 = \pi(D \cdot n_0 + t \cdot n_0^2) \quad (2)$$

When equation (2) is solved for t, equation (1) is satisfied, and then the thickness t of the belt is able to be obtained (step S2).

$$t = (L_0 - \pi \cdot D \cdot n_0)/\pi n_0^2 \quad (1)$$

When the amount of rotation to lower the lift stage from the position at the transfer height of $L_0$ to the position at the transfer height of L is indicated as follows: $\Delta n = n_0 - n$, the following equation (4) is satisfied.

$$L = L_0 - \pi(D \cdot \Delta n + t \cdot \Delta n^2) \quad (4)$$

Then, the transfer height L is measured for each transfer destination using one reference overhead transport vehicle, for example. When equation (4) is solved for $\Delta n$, equation (3) is obtained.

$$\Delta n = ((L_0 - L)/(\pi \cdot t) + (D/2t)^2)^{1/2} - (D/2t) \quad (3)$$

From equation (3), the amount of rotation $\Delta N$ to lower the lift stage from the uppermost position to the transfer destination at the height L can be obtained (step S3).

Then, the memory 43 or the like of the overhead transport vehicle 2 stores the thickness t of the belt, and the CPU 41 calculates the amount of rotation $\Delta N$ for each transfer or stores the calculated amount of rotation $\Delta N$ in the map memory 42. This enables each overhead transport vehicle 2 to accurately transfer goods to the corresponding one of transfer destinations. The teaching work for the overhead transport vehicle 2 may be performed only once before it is provided in the overhead transport vehicle system, and thus is able to be easily performed. In addition, the thickness t of the belt is measured throughout the overall length thereof. This does not cause a problem that while transfer to a transfer height within a certain range can be accurately performed, accurate transfer to a transfer height deviating from this range becomes difficult, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An overhead transport vehicle system comprising:
    a plurality of overhead transport vehicles each including:
        a winding drum to wind a hoisting material, attached to a lift stage to transfer goods, by lap winding; and
        a controller that controls an amount of rotation of the winding drum to control a height of the lift stage;
    a storage that stores the amount of rotation of the winding drum corresponding to an overall length of the hoisting material, unique to each of the plurality of overhead transport vehicles; and
    a calculator that calculates the amount of rotation of the winding drum, corresponding to a corresponding one of a plurality of transfer heights, for each of the plurality of overhead transport vehicles, from the amount of rotation unique to each of the plurality of overhead transports vehicle stored in the storage.

2. The overhead transport vehicle system according to claim 1, wherein the overhead transport vehicle includes an end sensor to detect that the hoisting material is paid out to an end portion of the hoisting material from the winding drum.

3. The overhead transport vehicle system according to claim 1, wherein
    the calculator is configured or programmed to calculate a thickness t of the hoisting material according to:

$$t=(L_0-\pi \cdot D \cdot n_0)/\pi n_0^2$$

where the amount of rotation of the winding drum corresponding to an overall length of the hoisting material is $n_0$, the overall length of the hoisting material is $L_0$, a diameter of the winding drum is D, and a circumference ratio is $\pi$.

4. The overhead transport vehicle system according to claim 3, wherein the calculator is configured or programmed to calculate the amount of rotation $\Delta n$ of the winding drum to lower the lift stage from a state where the hoisting material is wound by the overall length of the hoisting material to a position with a transfer height of L according to:

$$\Delta n=((L_0-L)/(\pi \cdot t)+(D/2t)^2)^{1/2}-(D/2t)$$

5. A teaching method for an overhead transport vehicle system to teach an amount of rotation of a winding drum corresponding to a corresponding one of a plurality of transfer heights for each of a plurality of overhead transport vehicles, the overhead transfer vehicle system being provided with the plurality of overhead transport vehicles each including a winding drum to wind a hoisting material, attached to a lift stage to transfer goods, by lap winding, and a controller that controls the amount of rotation of the winding drum to control a height of the lift stage, the teaching method comprising:

measuring the amount of rotation of the winding drum corresponding to an overall length of the hoisting material, unique to each of the plurality of overhead transport vehicles;

measuring a transfer height at each of a plurality of transfer positions using at least one of the plurality of overhead transport vehicle; and calculating the amount of rotation of the winding drum for each of the plurality of transfer positions for each of the plurality of overhead transport vehicles, from the transfer height measured and the amount of rotation of the winding drum corresponding to the overall length of the hoisting material, unique to each of the plurality of overhead transport vehicles.

\* \* \* \* \*